US006352081B1

(12) United States Patent
Lu et al.

(10) Patent No.: US 6,352,081 B1
(45) Date of Patent: Mar. 5, 2002

(54) METHOD OF CLEANING A SEMICONDUCTOR DEVICE PROCESSING CHAMBER AFTER A COPPER ETCH PROCESS

(75) Inventors: Danny Chien Lu, San Jose; Allen Zhao, Mountain View; Peter Hsieh, San Jose; Hong Shih, Walnut Creek; Li Xu, Santa Clara; Yan Ye, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,802

(22) Filed: Jul. 9, 1999

(51) Int. Cl.$^7$ ................................................. B08B 9/00
(52) U.S. Cl. ...................... 134/22.1; 134/1.1; 134/11; 134/22.14; 134/30; 134/26; 216/67; 216/74; 216/78; 438/905
(58) Field of Search ........................ 134/1.1, 11, 22.14, 134/30, 22.4, 26; 216/67, 78, 74; 438/905

(56) References Cited

U.S. PATENT DOCUMENTS

| | | | | |
|---|---|---|---|---|
| 5,100,504 A | | 3/1992 | Kawai et al. | 156/643 |
| 5,221,366 A | * | 6/1993 | Roberts et al. | 148/22 |
| 5,356,478 A | | 10/1994 | Chen et al. | 134/1 |
| 5,735,962 A | | 4/1998 | Hillman | 134/3 |
| 5,756,400 A | | 5/1998 | Ye et al. | 438/710 |
| 5,779,926 A | | 7/1998 | Ma et al. | 216/67 |
| 5,939,334 A | * | 8/1999 | Nguyen et al. | 438/689 |
| 5,993,679 A | | 11/1999 | Koide et al. | 216/74 |
| 2001/0009154 A1 | * | 7/2001 | Nguen et al. | 134/1 |

FOREIGN PATENT DOCUMENTS

| | | | | |
|---|---|---|---|---|
| GB | 2293795 | | 9/1996 | C23C/16/44 |
| JP | 3-62520 | * | 3/1991 | H01L/21/302 |
| JP | 11140652 | | 5/1999 | C23C/16/44 |
| WO | WO 98/36449 | | 8/1998 | H01L/21/302 |

OTHER PUBLICATIONS

Th. Kruck et al., *Microelectronic Engineering 37/38 (1997)*, pp. 121–123, "Low–temperature dry etching of copper using a new chemical approach".

Christopher Steinbrüchel. *Applied Surface Science 91 (1995)*, pp. 139–146, "Patterning of copper for multilevel metallization: reactive ion etching and chemical–mechanical polishing".

Yan Ye et al., *Electrochemical Society Proceedings*, vol. 96–12, pp. 222–233, "0.35 Micron and Sib–0.35–Micron Metal Stack Etch in a DPS Chamber—DPS Chamber and Process Characterization".

U.S. Patent Application Serial No. 08/911,878, of Yan Ye et al., filed Aug. 13, 1997, U. S. 6,008,140.

* cited by examiner

*Primary Examiner*—Randy Gulakowski
(74) *Attorney, Agent, or Firm*—Shirley L. Church

(57) ABSTRACT

The present invention is a method for removing deposited etch byproducts from surfaces of a semiconductor processing chamber after a copper etch process. The method of the invention comprises the following general steps: (a) an oxidation step, in which interior surfaces of the processing chamber are contacted with an oxidizing plasma; (b) a first non-plasma cleaning step, in which interior surfaces of the processing chamber are contacted with an H$^+$hfac-comprising gas; and (c) a second cleaning step, in which interior surfaces of the processing chamber are contacted with a plasma containing reactive fluorine species, whereby at least a portion of the copper etch byproducts remaining after step (b) are volatilized into gaseous species, which are removed from the processing chamber. The method of the invention is preferably performed at a chamber wall temperature of at least 150° C. in order to achieve optimum cleaning of the chamber at the chamber operating pressures typically used during the cleaning process. The dry cleaning method of the invention can be performed between wafer processing runs without opening the processing chamber, thereby minimizing potential contamination to the chamber as well as chamber downtime.

15 Claims, 5 Drawing Sheets

METHOD OF CLEANING A SEMICONDUCTOR DEVICE PROCESSING CHAMBER AFTER A COPPER ETCH PROCESS

BACKGROUND OF THE INVENTION

1. Field of the Invention

The present invention pertains to a method of cleaning a semiconductor device processing chamber after the performance of a copper etch process in that chamber. In particular, the invention pertains to a multi-step dry cleaning method which results in the removal of nonvolatile etch byproducts from surfaces of the processing chamber after a copper etch process.

2. Brief Description of the Background Art

In the multilevel metallization architecture used in present day semiconductor devices, aluminum is generally used as the material of construction for interconnect lines and contacts. Although aluminum offers a number of advantages in ease of fabrication, as integrated circuit designers focus on transistor gate velocity and interconnect line transmission time, it becomes apparent that copper is the material of choice for the next generation of interconnect lines and contacts. In particular, when the aluminum wire size becomes smaller than 0.5 $\mu$m, the electromigration resistance and the stress migration resistance of aluminum becomes a problem area. In addition, when the feature size of an aluminum-based contact requires an aspect ratio of greater than 1:1, it is difficult to obtain planarization of the substrate during the application of the next insulating layer over the contact area of the substrate. Further, the resistivity of copper is about 1.4 $\mu\Omega$cm, which is only about half of the resistivity of aluminum.

There are two principal competing technologies under evaluation by material and process developers working to enable the use of copper. The first technology is known as damascene technology. In this technology, a typical process for producing a multilevel structure having feature sizes in the range of 0.5 micron ($\mu$m) or less would include: blanket deposition of a dielectric material; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139–146.

The competing technology is one which involves the patterned etch of a copper layer. In this technology, a typical process would include deposition of a copper layer on a desired substrate (typically a dielectric material having a barrier layer on its surface); application of a patterned hard mask or photoresist over the copper layer; pattern etching of the copper layer using wet or dry etch techniques; and deposition of a dielectric material over the surface of the patterned copper layer, to provide isolation of conductive lines and contacts which comprise various integrated circuits. One advantage of the patterned etch process over the damascene process is that it is easier to etch fine patterns into the copper surface and then deposit an insulating layer over these patterns than it is to get the barrier layer materials and the copper to flow into small feature openings in the top of a patterned insulating film.

Methods for patterned etching of copper layers on the surface of semiconductor device substrates are disclosed, for example, in commonly owned, copending U.S. application Ser. Nos. 08/911,878 and 09/130,893, filed Aug. 13, 1997 and Aug. 7, 1998, respectively. Patterned etching of copper was performed in a plasma etch chamber including a decoupled plasma source (DPS) of the kind described by Yan Ye et al. at the Proceedings of the Eleventh International Symposium of Plasma Processing (May 7, 1996) and published in the *Electrochemical Society Proceedings* (Volume 96–12, pp. 222–233, 1996).

Unfortunately, patterned etching of copper is not a problem-free process. One potential productivity issue for copper etch in a high ion density (i.e., having an electron density of at least $10^{11}$ e$^-$/cm$^3$) etch chamber is the heavy deposition of nonvolatile etch byproducts onto available surfaces inside the etch chamber. These byproducts typically include, among others, compounds of copper, such as copper chloride (CuCl$_2$) and copper oxide (CuO), and compounds of silicon, such as silicon oxide (SiO$_2$).

If the byproduct is allowed to build up to a certain thickness (i.e., more than a few microns) on upper surfaces of the chamber, the weight of the deposited byproduct can cause pieces of the byproduct to break off the chamber surface and fall onto the surface of a wafer being processed in the chamber, resulting in contamination of the wafer and low product yield. Often, only a small number of wafers can be processed before the byproduct deposition on surfaces of the chamber builds up to an unacceptable level. The chamber must therefore be cleaned frequently between wafer runs, increasing the chamber downtime and decreasing the wafer throughput.

Several patents and publications disclose cleaning procedures for the removal of etch byproducts and residues from various surfaces. U.S. Pat. No. 5,100,504, issued Mar. 31, 1992 to Kawai et al., discloses a method of cleaning a silicon surface. In the first step, a silicon oxide film is etched away using a CHF$_3$ gas, which etches the silicon oxide film in preference to the underlying silicon. After the silicon oxide film is removed, organic matter of the C$_x$F$_y$ group remains on the silicon surface. In the second step, the organic matter is etched away using an NF$_3$ gas. The NF$_3$ gas easily formed F radicals which react with the organic matter to provide a residue-free silicon surface. At the time of forming this F radical, no residue which makes the silicon surface dirty is formed.

U.S. Pat. No. 5,356,478, issued Oct. 18, 1994 to Chen et al., discloses a plasma cleaning method for removing residues previously formed in a plasma treatment chamber by dry etching layers, such as photoresist and barrier layers, on a wafer. The method includes introducing a cleaning gas mixture of an oxidizing gas and a chlorine-containing gas into the chamber, followed by performing a plasma cleaning step. The plasma cleaning step is performed by activating the cleaning gas mixture and forming a plasma cleaning gas, contacting interior surfaces of the chamber with the plasma cleaning gas, and removing residues on the interior surfaces. The cleaning gas mixture can also include a fluorine-based gas. For instance, the cleaning gas can include Cl$_2$ and O$_2$ and, optionally, CF$_4$. An advantage of the cleaning method is that it is not necessary to open the plasma treatment chamber.

U.S. Pat. No. 5,735,692, issued Apr. 7, 1998 to Hillman, discloses a silicon substrate cleaning method and apparatus in which a hydrous cleaning solution is caused to evaporate at a temperature at about or above its azeotropic temperature and a cleaning vapor produced in this manner is applied to a substrate to remove unwanted oxide thereon. This method can be applied to a series of silicon substrates with consistent results. The method is said to produce an oxide-free substrate without contaminants, particulates or residue.

U.S. Pat. No. 5,756,400, issued May 26, 1998 to Ye et al., discloses an apparatus and process for plasma cleaning the interior surfaces of semiconductor processing chambers. The method is directed to the dry etching of accumulated contaminant residues attached to the inner surfaces of the plasma processing chamber and includes the steps of introducing a cleaning gas mixture of a halogen-containing gas; activating a plasma in an environment substantially free of oxygen species; contacting the contaminant residues with the activated cleaning gas to volatilize the residues; and removing the gaseous byproducts from the chamber. The etchant gaseous mixture comprises at least one fluorine-containing gas and an equal or lesser amount of at least one chlorine-containing gas. The invention is said to enable the intermittent use of the cleaning steps in an ongoing plasma processing of semiconductor wafers without chamber downtime and significant loss of wafer production.

PCT publication No. WO 9836449 of Itano, published Aug. 20, 1998, discloses an etching gas and chamber cleaning gas for Si films, $SiO_2$ films, $Si_3N_4$ films or high-melting metal silicide films, which etching gas contains at least one gaseous fluorine compound selected from the group consisting of those of formulae (1) to (3): (1) $C_nF_mH_1OC_xF_yH_z$, wherein n and x each represents an integer of 1 to 5; m, y, 1 and z each represents an integer of 0 to 11; provided that m and y, or 1 and z do not represent 0 at the same time; (2) $C_aF_{2a+1}$ OCF=$CF_2$ and (3) $C_aF_{2a+1}$ $COOCH_2F_3$, wherein a represents an integer of 1 to 3.

George et al. (in "Chemical Vapor Etching of Copper for Cu CVD Chamber Cleaning", Advanced Metallization & Interconnect System s for ULSI Applications, Conference Programs & Abstract, 1997) disclose the use of 1,1,1,5,5,5-hexafluoro-2,4-pentanedione ($H^+$hfac) to periodically remove excess deposited copper in the form of oxidized copper i n a single step in a Cu CVD chamber. As described by George et al., unoxidized copper will not be etched by $H^+$hfac. The disclosure of the foregoing reference is hereby incorporated by reference herein in its entirety.

Kruck & Schober (in "Low Temperature Dry Etching of Copper Using a New Chemical Approach", Microelectronic Engineering, 37/38,pp.121–126,1997) disclose the dry etching of foils of pure copper and patterned sputtered copper films using oxygen, tert-butyisonitrile, and hexfluoroacety-lacetone in a cold wall stopped flow reactor. Kruck & Schober describe the reaction of copper with $H^+$hfac. The disclosure of the foregoing reference is hereby incorporated by reference herein in its entirety.

It would be desirable to provide an etch chamber cleaning method that results in the removal of nonvolatile copper-containing and associated byproducts with minimal chamber downtime, thereby increasing wafer throughput.

SUMMARY OF THE INVENTION

Applicants have discovered a multi-step method for removing nonvolatile byproducts from interior surfaces of a semiconductor device processing chamber after the performance of a copper etch process upon a semiconductor substrate. The dry cleaning method of the invention can be performed between wafer processing runs without opening the processing chamber, thereby minimizing potential contamination to the chamber as well as chamber downtime.

The first step (a) of the method is an oxidation step which comprises contacting interior surfaces of the processing chamber with an oxidizing plasma (which is preferably generated from $Cl_2$), causing byproducts deposited on the interior surfaces of the process chamber during a copper etch process to be oxidized (a reaction in which electrons are transferred), so that the oxidation products can be removed in subsequent cleaning steps. The oxidizing plasma is preferably a high density plasma having an electron density of at least $10^{11}$ $e^-/cm^3$. The oxidation step is preferably performed using a substrate biasing power within the range of about 50 W to about 1000 W to produce a bias voltage on the substrate surface. The preferred substrate bias voltage is within the range of about –25 V and –250 V.

The next step (b) of the method is a first non-plasma cleaning step which comprises contacting interior surfaces of the processing chamber with a volatilized, fluorinated, unsaturated organic solvent, preferably 1,1,1,5,5,5-hexafluoro-2,4-pentanedione ($H^+$hfac), causing at least a portion of the oxidized byproducts to be volatilized into gaseous species, which are then removed from the chamber. The copper etch byproducts that are typically removed during the first cleaning step (b) include compounds of copper, such as copper chlorides and copper oxides.

The final step (c) of the method is a second cleaning step which comprises contacting interior surfaces of the processing chamber with a plasma containing reactive fluorine species, causing at least a major portion of the copper etch process byproducts remaining after the first cleaning step to be volatilized into gaseous species, which are then removed from the chamber. Silicon oxide is the principal copper etch byproduct that is removed during the second cleaning step (c).

The plasma used in the second cleaning step is generated from a fluorine-comprising gas, which is preferably selected from the group consisting of $C_xF_y$ (where x=1–5, and y $\geq$ 2x) and $SF_6$, and is most preferably $CF_4$. Argon is typically used in conjunction with $CF_4$ in order to provide physical bombardment of the chamber surfaces, in addition to the chemical reaction between $C_xF_y$ and the byproducts deposited on the chamber surfaces. $CF_4$ and argon are typically provided in a 1:1 flow rate ratio. The plasma is preferably a high density plasma having an electron density of at least $10^{11}$ $e^-/cm^3$.

The method of the invention is preferably performed at a chamber wall temperature of at least 150° C. in order to achieve optimum cleaning of the chamber.

BRIEF DESCRIPTION OF THE DRAWINGS

FIG. 2C shows all sampling locations of the copper etch process byproducts.

DETAILED DESCRIPTION OF THE PREFERRED EMBODIMENTS

We have discovered a method for dry cleaning of a semiconductor device processing chamber that results in the removal of nonvolatile byproducts from surfaces of the chamber after copper etch. The method itself and preferred process parameters for performing the method of the invention are described in detail below.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by a glow discharge, and a reference to "copper" includes alloys thereof.

Specific terminology of particular importance to the description of the present invention is defined below.

The term "bias power" refers to the power applied to the substrate support platen to produce a negative voltage on the substrate surface. Typically, the negative voltage is used to control ion bombardment energy and the directionality of ions toward a substrate.

The term "copper" refers to copper and alloys thereof, wherein the copper content of the alloy is at least 80 atomic % copper. The alloy may comprise more than two elemental components.

The term "decoupled plasma source" refers to a plasma generation apparatus which has separate controls for power input to a plasma source generator and to a substrate bias device. Typically, the plasma source power controller, controls the supply of inductively coupled RF power which is used to generate the plasma and determines the plasma density and the bias power controller controls the supply of RF power to a substrate support pedestal and is used to generate a DC bias voltage on the semiconductor substrate surface.

The term "H$^+$hfac" refers to 1,1,1,5,5,5-hexafluoro-2,4-pentanedione.

The term "oxidation" refers to any reaction in which one or more electrons are removed from a species, thus increasing its valence (oxidation state).

The term "plasma" refers to a partially ionized gas typically containing an equal number of positive and negative charges, as well as some other number of non-ionized gas particles.

II. An Apparatus for Practicing the Invention

Figure 1:
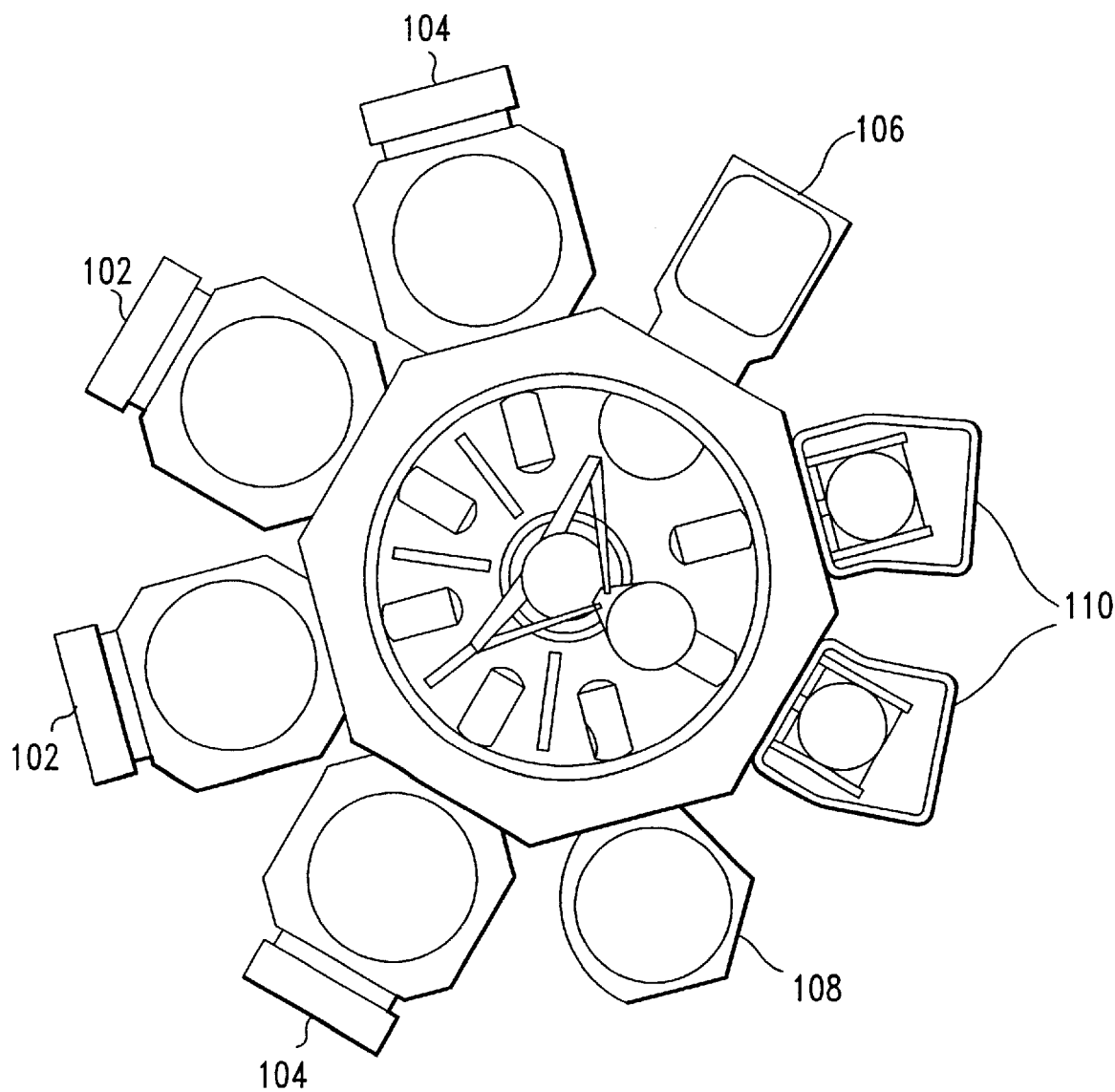
FIG. 1 is a cross-sectional schematic of an Applied Materials' CENTURA® etch system, which is an example of an etch processing apparatus which can be used for performing patterned etching of copper.

FIG. 1 shows a cross-sectional schematic of an etch processing apparatus that can be used for patterned etching of copper, the Applied Materials' CENTURA® DPS™ etch system (Applied Materials, Inc., Santa Clara, Calif.). The CENTURA® DPS™ etch system is a fully automated semiconductor fabrication system, employing a single-wafer, multi-chamber design which accommodates 200-mm wafers. As shown in FIG. 1, the CENTURA® DPS™ etch system includes decoupled plasma source etch chambers 102; advanced strip-and-passivation (ASP) chambers 104; wafer orienter chamber 106; cooldown chamber 108; and independently operated loadlock chambers 110.

Figure 2A:
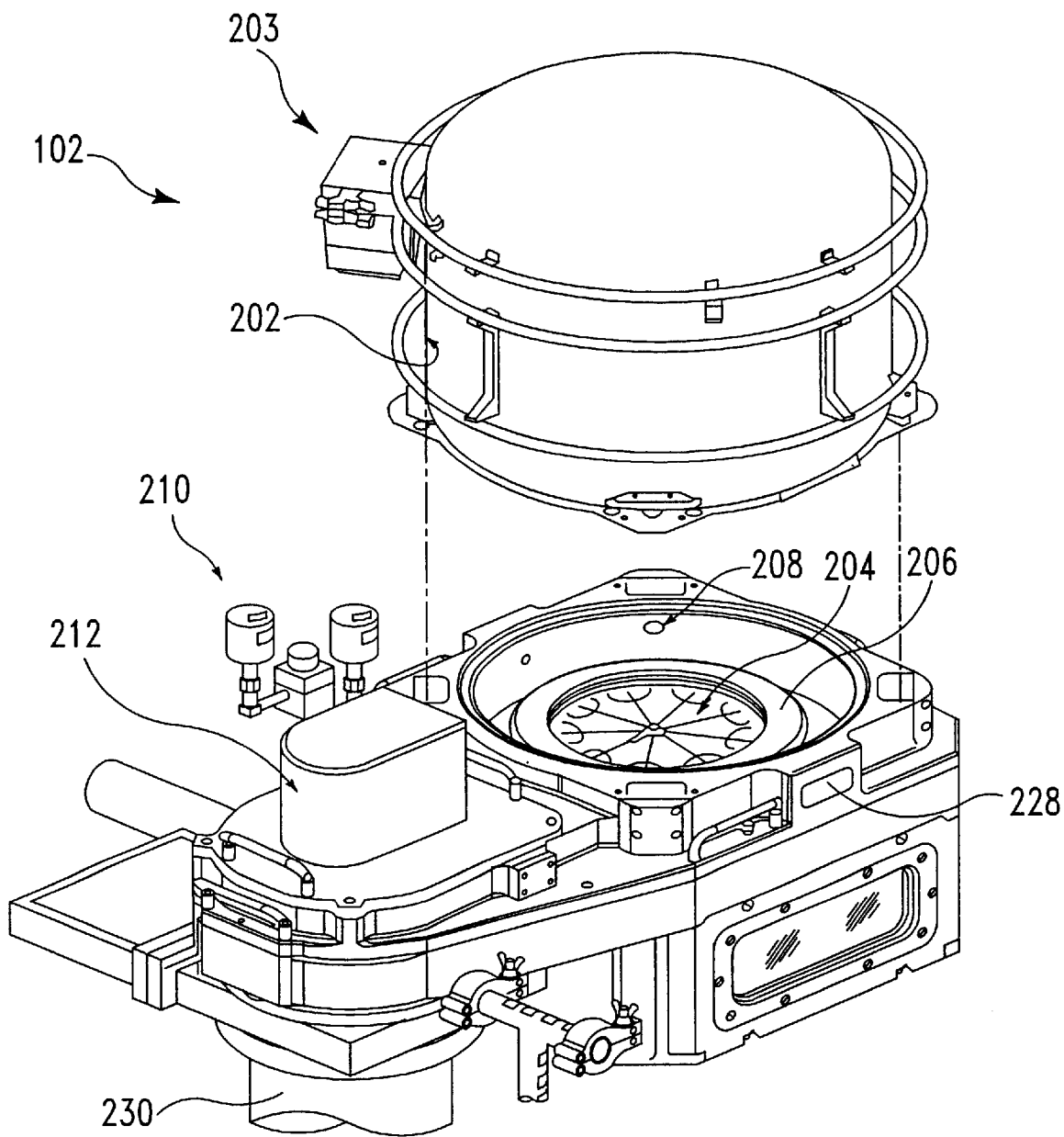
FIG. 2A is a detailed schematic of an individual metal etch chamber of the type used in the Applied Materials' CENTURA® DPS™ etch system shown in FIG. 1.

FIG. 2A shows a detailed schematic of an individual metal etch chamber 102 of the type used in the CENTURA® DPS™ etch system. The etch chamber 102 typically includes a ceramic dome 202 (interior to the upper portion of the etch chamber), a standard monopolar electrostatic chuck (ESC) 204, and a 1.0-inch ceramic focus ring 206. Gas is introduced into the chamber via four ceramic gas injection nozzles 208 for uniform gas distribution. Chamber pressure is controlled by a closed-loop pressure control system 210 with a unique plunger-style throttle valve 212.

The etch chamber 102 uses an inductive plasma source, frequency typically tuned at approximately 2 MHZ, to generate and sustain a high density plasma (i.e., having an electron density of at least $10^{11}$ e$^-$/cm$^3$). The wafer is typically biased with a 13.56 MHZ RF power source. The decoupled nature of the plasma source allows independent control of ion energy and ion density, which provides highly uniform plasma (<5% variation) with a wide process window over changes in source and bias power, pressure, and metal etch gas chemistry.

Figure 2B:
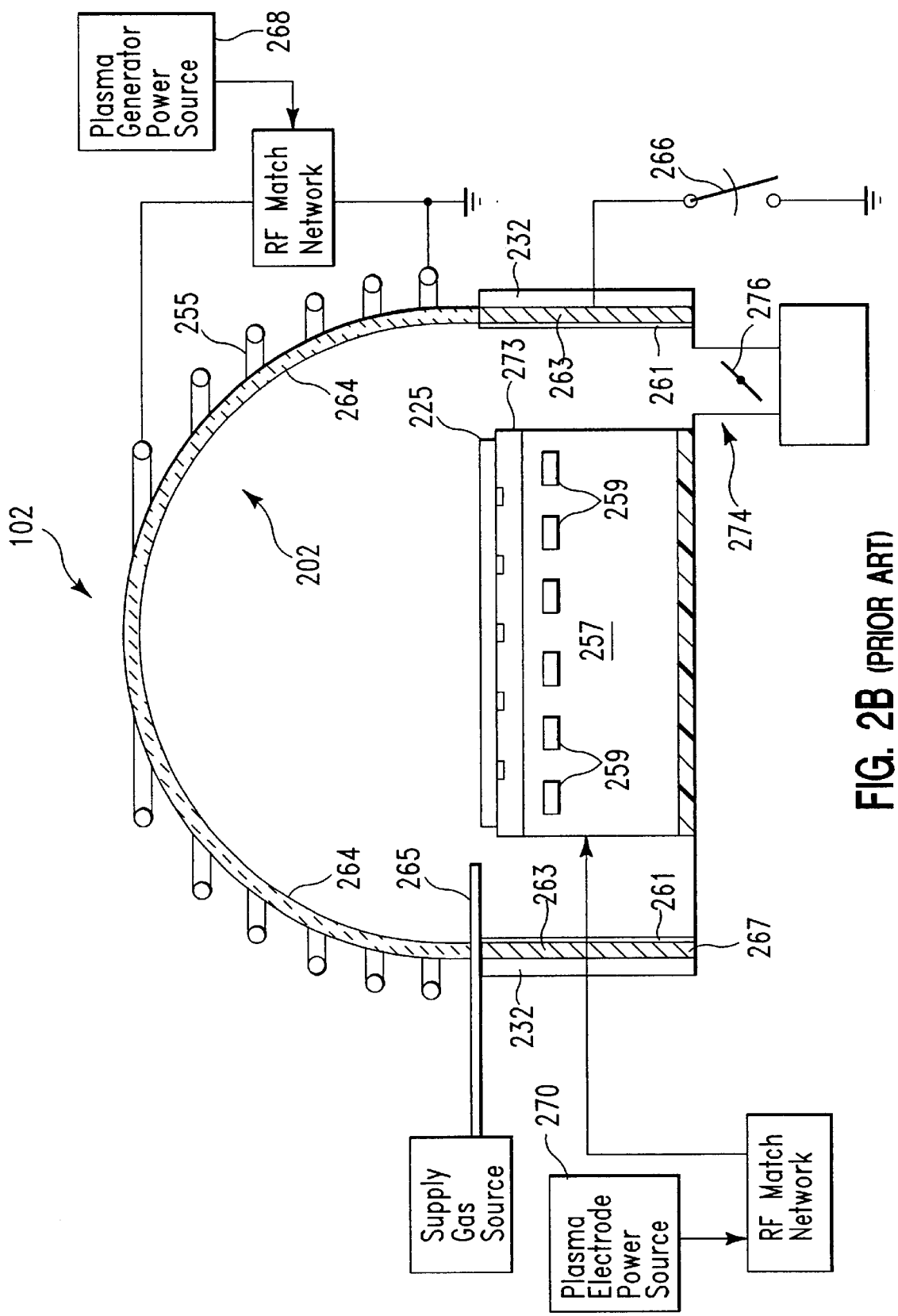
FIG. 2B is a vertical cross-sectional schematic of an individual metal etch chamber having a decoupled plasma source, as taken from U.S. Pat. No. 5,779,926.

FIG. 2B is a vertical cross-sectional schematic of an individual metal etch chamber 102, showing additional details. In the etching process, a substrate 225 is placed in the processing chamber 102 and held in place by means of an electrostatic chuck 273. The electrostatic chuck 273 overlies a cathode plasma electrode 257, which is connected to an independently controlled plasma electrode (RF) power source 270. The lower portion 263 of the processing chamber walls are formed from aluminum to provide an anode electrode which is grounded through switch 266. An anodized surface 261 is provided over the aluminium lower portion 263 of the process chamber walls. A plasma source gas is introduced into and distributed throughout the processing chamber 102 by means of a ceramic gas distributor 265 peripherally disposed above the substrate 225. Plasma ions are formed from the plasma source gas by applying an RF current to an inductive coil plasma generator 255, which is connected to an independently controlled plasma generator (RF) power source 268. The cathode electrode 257 is electrically biased with respect to the anode electrode 263 by applying an RF voltage to the cathode electrode 257 via power source 270, so that the plasma ions formed in the chamber 102 are attracted toward, energetically impinge upon, and etch the substrate 225. Spent process gas and etchant byproducts are exhausted from the process chamber 102 through an exhaust system 274, which consists of a throttle valve 276, a gate valve (not shown), a turbo pump (not shown), and a dry pump (not shown). The throttle valve 276 is provided in the exhaust for controlling the pressure in the chamber 102. A more detailed description of a metal etch chamber having a decoupled plasma source is found in U.S. Pat. No. 5,779,926, issued Jul. 14, 1998 to Ma et al., the disclosure of which is hereby incorporated by reference herein in its entirety.

III. The Method for Removing Nonvolatile Byproducts from Heated Interior Surfaces of a Semiconductor Device Processing Chamber After a Copper Etch Process Prior to developing a method for dry cleaning of a processing chamber after a copper etch process, it was important to obtain certain information characterizing the etch byproducts, such as what the etch byproducts are, how they distribute, how fast they deposit onto the surface, etc. Therefore, we performed the experiments described in Examples One and Two, below, for the purpose of characterizing the byproducts which are deposited on processing chamber surfaces during copper etch. All experiments were conducted without the use of a focus ring. The present multi-step cleaning method is designed to more effectively and completely remove byproduct build-up based on the composition of the byproduct layers to be removed.

EXAMPLE ONE

We performed four experiments (I–IV), by etching a number of checkerboard patterned wafers with the standard copper film stack (shown in FIG. 3), in order to collect and analyze samples of copper etch byproducts deposited on various surfaces inside an etch processing chamber of a CENTURA® DPS™ etch system (shown in FIGS. 1 and 2). The samples were collected following copper etch, after venting of the etch process chamber. The Experiment I copper etch was conducted with a cathode temperature of approximately 150° C. The Experiments II and III copper etch were conducted with a cathode temperature of approximately 200° C. The Experiment IV copper etch was conducted with a cathode temperature of approximately 250° C. The chamber wall and ceramic dome were maintained at temperatures of 80° C. and 90° C., respectively, in each of the four experiments.

The deposition samples in experiments I, II, and IV were scraped from the chamber surfaces. The deposition samples in experiment III were deposited on oxide wafer coupons taped to the chamber surfaces with KAPTON® tape (a polyimide film, available from DuPont, Circleville, Ohio). The interior surfaces of the DPS™ etch processing chamber typically comprise a ceramic material, which is most often aluminum oxide.

Figure 2C:
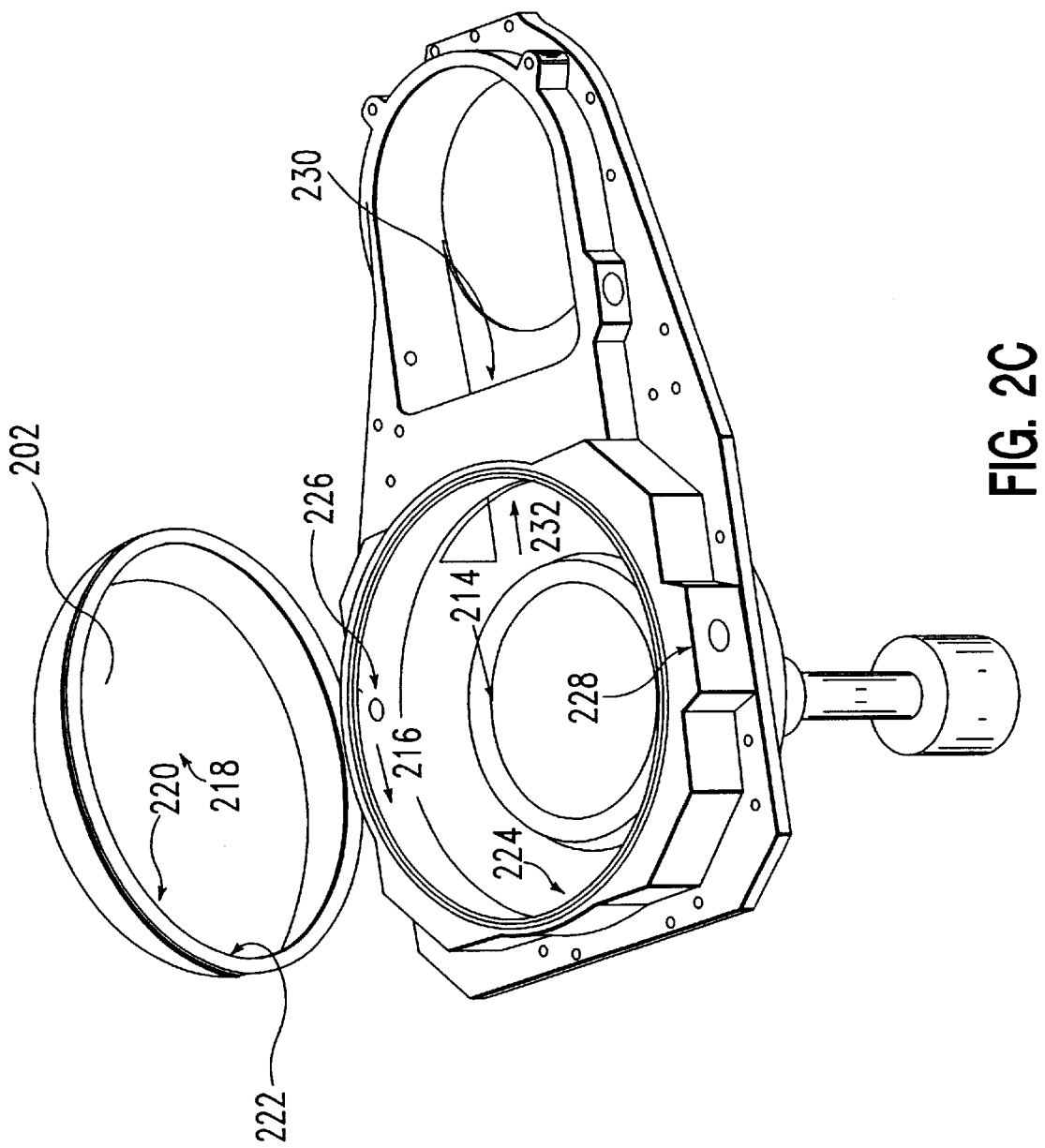
FIG. 2C is a schematic of the upper chamber portion of an individual metal etch chamber having a decoupled plasma source.

Referring to FIG. 2C, in Experiment I, deposition samples were collected from the dome 202 and capture ring 214; in Experiment II, from the dome 202, the capture ring 214, and the chamber wall 216; in Experiment III, from the dome center 218, dome coil 220, dome edge 222, slit valve 224, simplified gas distributor 226, quartz crystal microbalance 228, and the chamber wall 230 at the pumping port connected to the turbo; and in Experiment IV, from the dome center 218, dome coil 220, dome edge 222, capture ring 214, slit valve 224, simplified gas distributor 226, pumping port wall 232 connected to the turbo, and at turbo wall 230. (The function of the quartz crystal microbalance 228 is to determine the rate at which materials are being deposited on, or removed from, chamber surfaces.)

Two types of chemical analysis were employed: XPS (X-ray Photoelectron Spectroscopy) and IC/ICP (Ion Chromatography/Inductively Coupled Plasma). The processes for both XPS and IC/ICP are well-known in the semiconductor and industrial surface chemistry arts. The deposition samples in experiments I, III, and IV were analyzed by XPS. The deposition samples in experiment II were analyzed by IC/ICP.

Results of the chemical analyses are presented in Table One, below. The results are presented as a percentage (wt. %, excluding any hydrogen content) of the total deposition on the particular surface.

is that the gap between the inductive coil and the dome was somehow varied, which may have created a local difference in radical and/or ion concentrations.

Judging from the binding energy spectra, it was shown that copper is highly oxidized to $Cu_xO$ and/or $CuCl_y$ (where x=1 or 2 and y=1 or 2), so that there is more $Cu^{+2}$ and less $Cu^{+1}$ in the etch byproducts. The copper concentration increased significantly from the dome to the chamber wall, indicating that the copper byproducts have difficulty either diffusing through the plasma or adhering to the dome surface.

Excluding sample III-dm, the data shows a relatively constant concentration of chlorine, with a slight increase from the dome to the chamber wall. Samples III-dc and III-de showed higher Cl:Cu atomic ratios than dome samples collected in experiment IV, which means more $CuCl_2$ was present within the dome deposition when the substrate cathode was colder. However, all wall samples are most likely CuCl, regardless of the cathode temperature.

Silicon was observed as $SiO_2$ in all samples, which is believed to be due to ion sputtering of the hard mask. A lower silicon oxide concentration was seen both in the dome area and at the chamber wall when the substrate cathode was colder during copper etch (experiments II and III). The concentration of $SiO_2$ increased from the chamber wall to the dome.

Carbon was primarily present in the form of hydrocarbons (C—C, C—H), with a lesser amount of oxygen functionalities (C—O, C=O, and O—C=O). A significantly greater amount of carbon was noted in the dome samples III-dc, III-de, and III-dm, in comparison with other experimental data. The increased amount of carbon may have come from the KAPTON® tape which was used to attach the oxide wafer coupons to the chamber surfaces. The concentration of TABLE One Weight Percent Chemical Analyses of Copper Etch Byproduct Deposition

| Location* | Ta | Cu | F | Cl | O | N | P | C | Si | B |
|---|---|---|---|---|---|---|---|---|---|---|
| I-d | 10.1 | 13.6 | — | 13.5 | 51.6 | — | — | 0.3 | 10.9 | — |
| II-d | <0.1 | 26.0 | — | 12.4 | — | — | — | — | 12.3 | <0.1 |
| III-dc | — | 11.3 | 1.8 | 19.3 | 16.8 | 6.1 | 0.7 | 34.9 | 9.2 | — |
| III-dm | — | 1.0 | 1.0 | 1.7 | 47.4 | 1.6 | 2.4 | 12.3 | 32.5 | — |
| III-de | — | 23.2 | 1.0 | 20.8 | 11.7 | 5.7 | 0.2 | 33.1 | 4.4 | — |
| IV-dc | 7.2 | 21.9 | — | 13.5 | 33.8 | 2.2 | 3.8 | 3.7 | 14.0 | — |
| IV-dm | 4.3 | 26.6 | — | 14.3 | 32.4 | 2.3 | 5.1 | 3.9 | 11.1 | — |
| IV-de | 3.0 | 24.3 | — | 13.7 | 35.2 | 3.1 | 5.9 | 4.7 | 10.1 | — |
| I-cr | 10.6 | 16.1 | — | 13.7 | 42.2 | — | — | 4.3 | 13.1 | — |
| II-cr | <0.1 | 27.1 | — | 14.0 | — | — | — | — | 12.3 | <0.1 |
| IV-cr | — | 38.8 | — | 17.0 | 25.2 | 1.0 | 1.9 | 6.5 | 9.6 | — |
| II-w | <0.1 | 23.8 | — | 14.1 | — | — | — | — | 12.3 | <0.1 |
| III-sv | — | 43.9 | 0.3 | 18.9 | 21.5 | 2.6 | 3.2 | 8.1 | 1.7 | — |
| III-sgd | — | 41.5 | 0.3 | 16.0 | 27.1 | 2.2 | 5.1 | 5.9 | 2.0 | — |
| III-qcm | — | 43.0 | 0.2 | 20.9 | 22.9 | 2.5 | 3.8 | 5.5 | 1.2 | — |
| III-t | — | 43.2 | 0.2 | 17.9 | 22.4 | 2.4 | 2.7 | 8.9 | 2.3 | — |
| IV-sv | 2.0 | 37.7 | — | 19.2 | 24.0 | 2.2 | 2.5 | 6.1 | 6.4 | — |
| IV-sgd | — | 36.8 | — | 24.9 | 23.0 | 3.6 | 0.9 | 6.4 | 4.5 | — |
| IV-t | 2.0 | 34.6 | — | 15.6 | 29.6 | 1.5 | 3.1 | 4.1 | 9.4 | — |

*Location within the processing chamber: d = dome; dc = dome center; dm = dome coil; de = dome edge; cr = capture ring; sv = slit valve; sgd = simplified gas distributor; qcm = quartz crystal microbalance; t = chamber wall at pumping port connected to the turbo; w = chamber wall.

Among all of the XPS data (experiments I, III, and IV), sample I-d showed the highest concentrations of tantalum and oxygen, with the lowest concentration of carbon. This is believed to be due to variable chamber conditions during experiment I. Sample III-dm was quite unique (within the same dome subgroup) in terms of the high concentrations of silicon, low concentrations of copper and chlorine, and the bonding states of these elements. One possible explanation carbon decreased moderately from the chamber wall to the dome when a hot cathode was used (experiment IV).

A small amount of tantalum was shown in the form of tantalum oxide ($Ta_2O_5$). Nitrogen was detected as an ammonium salt ($NH_4$) for all samples except III-dm, which showed primarily nitride species. The presence of fluorine in the byproduct samples depended on whether any fluorine-comprising etch plasma source gas was used. Phosphorus was observed as phosphate in experiments III and IV. The amounts of boron in all samples were essentially below the detection limits of either XPS or IC/ICP (i.e., typically less than about 0.1 atomic percent).

In summary, we found that deposition of etch byproducts is the result of a complex interaction of etch chemistry, hardware configuration, plasma coupling, reaction conditions, process chamber location, etc. The principal etch byproducts which remained on process chamber surfaces after completion of copper etch were found to be copper chloride ($CuCl_x$), from the plasma-assisted chemical etch of copper using chlorine-based chemistry; oxidized copper ($Cu_yO$), from the reaction between copper and oxygen released from $SiO_2$ etch; and silicon oxide ($SiO_2$), from ion sputtering of the hard mask. Lesser amounts of hydrocarbon polymers (from the reaction of remaining photoresist or added carbon-containing species used as passivant), $Ta_2O_5$, $NH_4^+$, $PO_4^{3-}$ were also present.

EXAMPLE TWO

Three runs with varying numbers of wafers etched were conducted to provide an indication of the thickness of byproduct deposition on oxide wafer coupons taped onto various surfaces inside a DPS™ etch processing chamber. After each wet clean, the chamber was seasoned. The general procedure for wet clean typically includes the following steps: 1) deionized water rinse for 10 minutes; 2) deionized water ultrasonic for 1 hour; 3) deionized water rinse for 10 minutes; 4) ammonium hydroxide/hydrogen peroxide (1:1) soak for approximately 30 minutes (ceramic parts only); 5) deionized water rinse for 10 minutes; 6) $N_2$ blow dry; and 7) convection oven bake at 120° C. for 2 hours. The general procedure for seasoning of the chamber involves preparing the chamber conditions for copper etch, then cycling either ten blank oxide wafers or ten blank copper wafers or ten patterned "checkerboard" wafers. The standard "baseline" process recipe for copper etch is used during the seasoning procedure.

Figure 3:
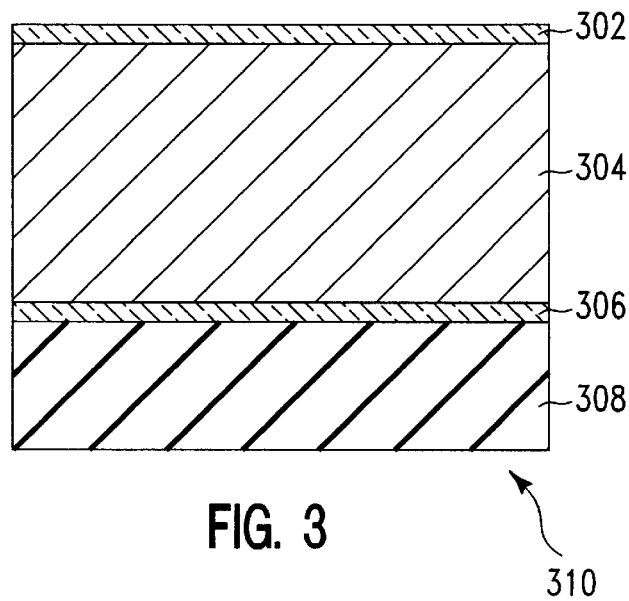
FIG. 3 shows a typical film stack prior to performance of copper etch. The film stack comprised the following layers, from top to bottom: 250 Å Ta, 302; 1 μm Cu, 304; 250 Å Ta, 306; 5 k Å thermal oxide, 308; on a silicon substrate, 310. (NOTE: Layer thicknesses are not shown to scale.)

Varying numbers of patterned checkerboard wafers were then etched using a cathode temperature of 285° C. and a chamber wall temperature of about 200° C. A typical film stack prior to etch is shown in FIG. 3. The film stack prior to etching included the following layers, from top to bottom: 250 Å Ta wetting layer, 302; 1 μm Cu fill layer, 304; 250 Å Ta barrier layer, 306; 5000 Å thermal oxide layer, 308; on a silicon substrate, 310. (Layer thicknesses are not shown to scale.)

Process conditions for etch were as follows: Breakthrough etch through the 250 Å Ta layer 302: 150 sccm argon; 15 mTorr process chamber pressure; 1200 W source power; 500 W bias power; 55 seconds etch time. Main etch through the 1, μm Cu layer 304 and 250 Å Ta barrier layer: 50 sccm HCl; 5 sccm $BCl_3$; 5 sccm $CHF_3$; 50 sccm $N_2$; 100 sccm argon; 25 mTorr process chamber pressure; 1200 W source power; 700 W bias power; 180 seconds etch time. After etching varying numbers (5, 10, or 15) of wafers, we measured the thickness of byproduct deposition on wafer coupons taped onto surfaces at various locations within the chamber. The deposition thickness was measured by conducting a profiler step height measurement using a Tencor P-2 Long Scan Profiler (Tencor Instruments, Mountain View, Calif.).

Figure 4:
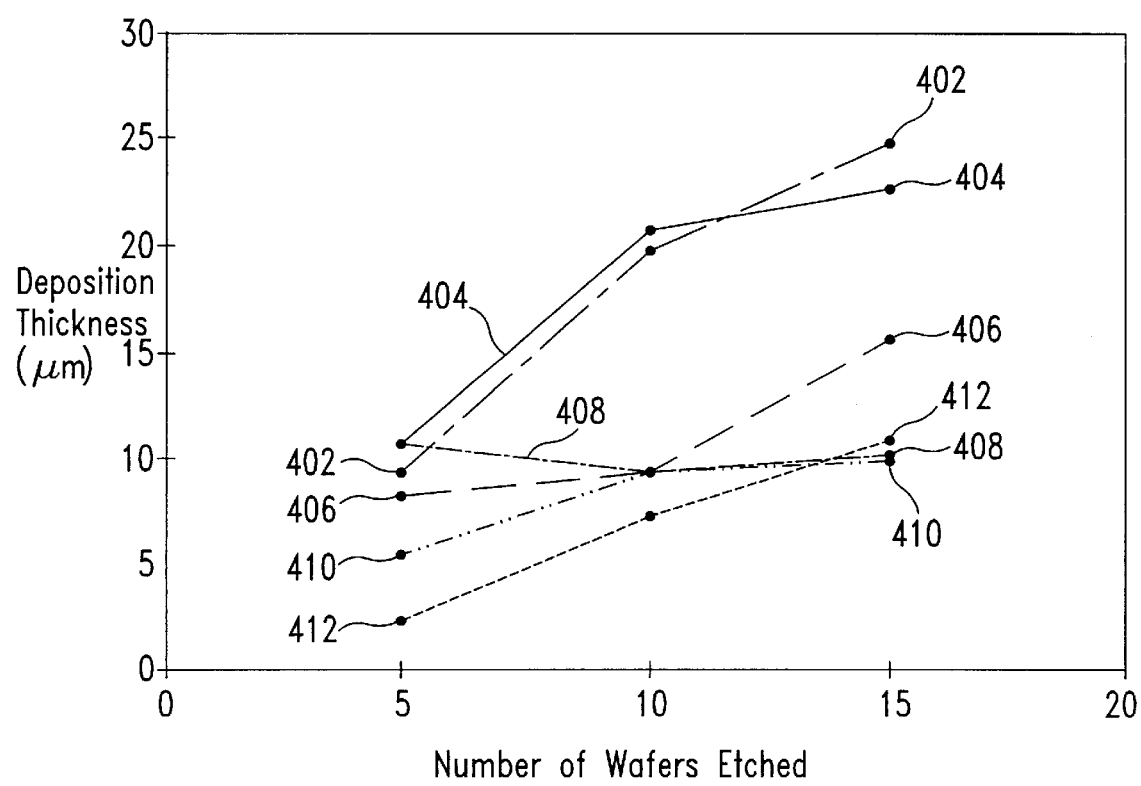
FIG. 4 is a graph showing byproduct deposition thickness (in μm) versus number of wafers etched.

FIG. 4 shows byproduct deposition thickness (in μm) versus number of wafers etched. Deposition thickness at the turbo side of the chamber wall is designated by reference numeral 402; deposition thickness at the dome center, 404; deposition thickness at the slit valve, 406; deposition thickness at the gas nozzle, 408; deposition thickness at the dome edge, 410; deposition thickness at the dome coil, 412.

As shown in FIG. 4, heavy deposition (~20–25 μm) of etch byproducts was seen at the turbo side of the chamber wall 402 and at the dome center 404 after etching only 15 wafers. Deposition at the slit valve 406 was about 15 μm thick. About 10 μm thick deposition was observed at the gas nozzles 408, dome edge 410, and dome coil 412 after etching 15 wafers. These results indicate a high likelihood of deposition fallout onto the wafer surface, since the location of the deposition sample on the chamber wall at the pumping port connected to the turbo, shown in FIG. 2A at 230, is above the wafer surface. As a result, there is likely to be contamination of the wafer and low product yield.

Based on the information obtained in Examples One and Two, above, concerning the types of etch byproducts that were being deposited on chamber surfaces, the surfaces of the chamber on which they were being deposited, and the relative amounts in which they were being deposited, we were able to design and develop a multi-step cleaning process to more efficiently and more completely remove etch byproducts from the etch process chamber surfaces. The process chamber dry cleaning method of the invention comprises the following general steps:

(a) an oxidation step comprising contacting interior surfaces of the processing chamber with an oxidizing plasma, whereby byproducts deposited on the interior surfaces during a copper etch process are oxidized;

(b) a first non-plasma cleaning step comprising contacting interior surfaces of the processing chamber with a gas comprising a fluorinated, unsaturated organic solvent, such as $H^+hfac$, whereby at least a portion of the oxidized byproducts are volatilized into gaseous species, which are then removed from the chamber; and (c) a second cleaning step comprising contacting interior surfaces of the processing chamber with a plasma containing reactive fluorine species, whereby at least a portion of the copper etch process byproducts remaining after step (b) are volatilized into gaseous species, which are then removed from the chamber.

The method of the invention is preferably performed at a chamber wall temperature of at least 150° C. in order to achieve optimum cleaning of the chamber. Preferably, the chamber wall is maintained at a temperature of at least 200° C. during performance of the dry cleaning method of the invention.

Referring to FIG. 2A, gases are introduced into the processing chamber by means of the gas injection nozzles 208, and volatilized copper etch byproducts are removed from the chamber by means of a gas flow exit port (not shown), which is located beneath either the throttle valve 212 or the exit port of the turbo pump 230.

The first step (a) of the cleaning method is an oxidation step which comprises introducing a plasma generated from a gaseous oxidizing agent into the processing chamber and contacting interior surfaces of the chamber with the oxidizing plasma. The purpose of the oxidation step is to oxidize copper-containing byproducts prior to performing the first cleaning step with $H^+hfac$. It is very important that the copper-containing byproducts be oxidized to $Cu^{+2}$ in order for them to react with, and be volatilized by, $H^+hfac$ during subsequent cleaning steps.

The oxidizing agent in step (a) is preferably $Cl^2$. Alternatively, other oxidizing agents, such as $O_2$, may be used. The plasma is preferably a high density plasma having an electron density of at least $10^{11}$ $e^-/cm^3$. A bias power within the range of about 50 W to about 1000 W may be employed during step (a). The substrate biasing power typically ranges between about 200 W to about 300 W. Preferably, a substrate bias voltage within the range of about −25 V and −250 V is generated.

The second step (b) of the method is a first cleaning step which comprises introducing a (non-plasma) gas comprising volatilized $H^+$hfac into the processing chamber and contacting interior surfaces of the chamber with the $H^+$hfac-comprising gas. The $H^+$hfac reacts with the oxidized copper-containing etch byproducts, causing them to be volatilized into gaseous species, which can then be easily removed from the chamber.

$H^+$hfac is available from Air Products & Chemicals, Inc. (Allentown, Pa.). $H^+$hfac is supplied as a liquid in an ampule. The ampule is provided with a heater on the outside of the tank. The $H^+$hfac must be heated to its boiling point (150° C. at atmospheric pressure) and converted to a gaseous state before it can be flowed into the processing chamber. No plasma is generated during this step. As described above, the entire process is typically performed at a chamber wall temperature of at least 150° C. in order to ensure that reaction products between $H^+$hfac and the etc.

Following volatilization using $H^+$hfac, the gaseous byproducts are removed from the chamber via the gas flow exit port. The copper etch byproducts that are typically removed during the first cleaning step (b) include compounds of copper, such as copper chlorides and copper oxides.

The final step (c) of the method is a second cleaning step which comprises introducing a plasma generated from a fluorine-comprising gas into the processing chamber and contacting interior surfaces of the chamber with the plasma. The purpose of the second cleaning step is to volatilize any silicon oxides sputtered during the etch step and any copper etch byproducts remaining after the first cleaning step (b). The volatilized reaction products between the fluorine-comprising gas and such byproducts can then be easily removed from the chamber.

The plasma is generated from a fluorine-comprising gas, which is preferably selected from the group consisting of $C_xF_y$ (where x=1–5, and y≧2x) and $SF_6$, and is most preferably $CF_4$. $CF_4$ and argon are typically provided in a 1:1 flow rate ratio. The plasma is preferably a high density plasma having an electron density of at least $10^{11} e^-/cm^3$.

The gaseous reaction products which are volatilized during the second cleaning step (c) are removed from the chamber via the gas flow exit port. The volatilized byproducts that are removed during the second cleaning step may include silicon fluoride, silicon chloride, carbon monoxide, carbon dioxide, tantalum chloride, and copper chloride.

The dry cleaning method of the invention is preferably performed using a process chamber pressure within the range of about 50 mTorr to about 200 mTorr.

The copper etch byproducts which are removed from the chamber during step (b) or step (c) typically include copper-comprising compounds and silicon-comprising compounds, most typically copper chloride, copper chloride, and silicon oxide. The volatilized byproducts removed from the chamber may further include other compounds comprising tantalum, fluorite, chlorine, oxygen, nitrogen, phosphorus, carbon, or boron.

Typical process conditions for performing steps (a)–(c) of the method of the invention are presented in Table Two, below.

TABLE Two

Typical Process Conditions for Dry Cleaning of a Semiconductor Device Processing Chamber After Copper Etch

| Process Condition | Oxidation Step | First Cleaning Step | Second Cleaning Step |
| --- | --- | --- | --- |
| Gas Flow (sccm) | 50–200 $Cl_2$ | 50–500 $H^+$hfac | 100 $CF_4$/100 Ar -OR- 200 $SF_6$ |
| Time (s) | 15–60 | 30–120 | 15–60 |
| Temperature (° C.) | | | |
| Dome | 150–250 | 150–250 | 150–250 |
| Chamber Wall | 200 | 200 | 200 |
| Cathode | 275–300 | 275–300 | 275–300 |
| Process Chamber Pressure (mTorr) | 50–70 | 50–70 | 50–70 |
| Source Power (W) | 500–2000 | — | 500–2000 |
| Bias Power (W) | 50–1000 | — | — |
| Plasma Electron Density ($e^-/cm^3$) | ≧$10^{11}$ | — | ≧$10^{11}$ |
| Byproducts Typically Removed | $CuCl_y$ | $Cu_xO$ $CuCl_y$ | $SiO_x$ |

As previously described, all steps of the, method of the invention should be performed at a chamber wall temperature of at least 150° C. In order to achieve optimum cleaning of the chamber, the chamber wall is preferably maintained at a temperature of at least 200° C. during performance of the dry cleaning method of the invention. The temperature of the lower portion of the chamber wall is maintained by means of a heating jacket 232 positioned on the outside chamber wall 263, as shown in FIG. 2B. The temperature of the dome 202 (i.e., the upper portion of the processing chamber wall) is maintained by balancing the heating provided by radiant lamps, air fan circulation or cool air injector, and chill water channels within the dome temperature control unit (DTCU) (shown in FIG. 2A as 203). The cathode temperature is maintained by means of resistance heat channels 259, present within and located toward the upper surface of cathode 257.

The dry cleaning method of the present invention can be performed between wafer processing runs without opening the processing chamber, thereby minimizing potential contamination to the chamber as well as chamber downtime. The frequency at which the dry cleaning method of the invention should be performed is dependent on a variety of factors, including the particular apparatus and copper etch process being used, as well as the amount of byproduct build-up which is tolerable in a given situation.

The above described preferred embodiments are not intended to limit the scope of the present invention, as one skilled in the art can, in view of the present disclosure, expand such embodiments to correspond with the subject matter of the invention claimed below.

We claim:

1. A method for removing nonvolatile byproducts from interior surfaces of a semiconductor device processing chamber after a copper etch process, wherein the method comprises the following steps:

(a) an oxidation step comprising contacting interior surfaces of said processing chamber with an oxidizing plasma, whereby copper containing byproducts deposited on said interior surfaces during a copper etch process are oxidized;

(b) a first non-plasma cleaning step comprising contacting interior surfaces of said processing chamber with a gas comprising a fluorinated, unsaturated organic solvent, whereby at least a portion of said oxidized copper containing byproducts are volatilized into gaseous species, which are then removed from said processing chamber; and (c) a second cleaning step comprising contacting interior surfaces of said processing chamber with a plasma containing reactive fluorine species, whereby at least a portion of said copper containing etch process byproducts remaining after step (b) are volatilized into gaseous species, which are then removed from said processing chamber.

2. The method of claim 1, wherein surfaces within said processing chamber are maintained at a temperature of at least 150° C.

3. The method of claim 1, wherein surfaces within said processing chamber are maintained at a temperature of at least 200° C.

4. The method of claim 1 or claim 2, wherein said oxidizing plasma is generated from $Cl_2$.

5. The method of claim 1 or claim 2, wherein said fluorinated, unsaturated organic solvent is 1,1,1,5,5,5,-hexafluoro-2,4-pentanedione.

6. The method of claim 1 or claim 2, wherein said oxidizing plasma is a high density plasma having an electron density of at least $10^{11}$ $e^-/cm^3$.

7. The method of claim 1 or claim 2, wherein said oxidation step is performed using a substrate bias voltage within the range of about −25 V and about −250 V.

8. The method of claim 1 or claim 2, wherein said plasma containing reactive fluorine species is generated from a gas selected from the group consisting of $C_xF_y$ and $SF_6$, where x=1–5 and y≧2x.

9. The method of claim 8, wherein said fluorine-comprising plasma is generated from $CF_4$.

10. The method of claim 9, wherein said fluorine-comprising plasma is generated from $CF_4$ and argon.

11. The method of claim 10, wherein said $CF_4$ and said argon are provided at a flow rate ratio of 1:1.

12. The method of claim 1 or claim 2, wherein said fluorine-comprising plasma is a high density plasma having an electron density of at least $10^{11}$ $e^-/cm^3$.

13. The method of claim 2, wherein said method is performed using a process chamber pressure within the range of about 50 mTorr to about 200 mTorr.

14. The method of claim 1 or claim 2, wherein interior surfaces of said processing chamber comprise ceramic.

15. The method of claim 1 or claim 2, wherein interior surfaces of said processing chamber comprise aluminum oxide.

* * * * *